2,929,751

MANUFACTURE OF SEMICONDUCTOR DEVICES

Harold Dennis Blakelock, South Ruislip, England, assignor to The General Electric Company Limited, London, England No Drawing. Application November 6, 1957
Serial No. 694,726

Claims priority, application Great Britain
November 15, 1956

5 Claims. (Cl. 148—1.5)

This invention relates to the manufacture of semiconductor devices, and is applicable, for example, to the forming of a junction in a semiconductor, or to the forming of a mechanical and/or electrical connection to a semiconductor or to a rectifying element incorporating a semiconductor. By junction is meant a boundary between two regions of a semiconductor having appreciably different electrical characteristics; a common example of such a junction is a so-called P–N junction.

One known method of manufacturing a semiconductor rectifying element comprises the steps of applying to the surface of a solid body of a semiconductor a material which consists at least partly of a substance capable of acting as a significant impurity (that is to say donor or acceptor impurity), the material being fused and caused to dissolve part of the body, and subsequently allowing the fused material to solidify in such a manner that a layer of the semiconductor containing said substance is redeposited from the fused material contiguous with the remainder of the semiconductor body. In one specific application of this method the semiconductor is germanium and the material is indium; a slice of indium is placed upon the surface of a disc cut from a germanium crystal and the combination is heated in an inert or a reducing atmosphere i.e., a non-oxidizing atmosphere. However when making rectifying elements incorporating junctions of large area this method may lead to the formation of gas voids at the indium-germanium interface due to the trapping of gas as the indium melts. The formation of voids by this mechanism may be avoided by carrying out the heating in vacuum, but in this case voids may be produced due to outgassing of the metals as the temperature rises. Because of the formation of voids at the indium-germanium interface it may be difficult to form large area junctions having uniformly good electrical properties over the whole area of the junction.

It is one object of the present invention to provide a method of forming a junction in a semiconductor in which this difficulty is mitigated.

According to one aspect of the present invention, in a method of forming a junction in a semiconductor by applying to the surface of a solid body of the semiconductor a material which consists at least partly of a substance capable of acting in the semiconductor as a significant impurity, a quantity of the said material is fused in contact with the said surface in vacuo, and heated further in an inert atmosphere or a reducing atmosphere, and caused to dissolve part of the body, the fused material being allowed subsequently to solidify in an inert or reducing atmosphere in such a manner that a layer of the semiconductor containing said substance is redeposited from the fused material contiguous with the remainder of the semiconductor body.

By an inert atmosphere is meant an atmosphere of a gas or gases which is not or are not capable of reacting chemically with the material in the conditions under which the material is applied to the surface, the atmosphere being substantially free from ingredients which might so react with the material.

Prior to application of the said material, the surface may be treated so that it is capable of being wetted readily only over a part or restricted portion of its area, the material being applied in such quantity that when fused it substantially covers but does not extend beyond the said part or portion. The surface may be so treated by suitably plating the said part or restricted portion, or alternatively by evaporating onto the said part or restricted portion a layer of a material which enhances the wetting of the surface by the fused impurity-containing material.

According to another aspect of the present invention, in a method of forming a mechanical and/or electrical connection to a semiconductor or to a rectifying element incorporating a semiconductor, by applying to the surface of the semiconductor or rectifying element a fused metal, and subsequently allowing the metal to solidify to form the connection, the metal is fused in contact with the said surface in vacuo, heated further in an inert or a reducing atmosphere, and subsequently allowed to solidify in an inert or reducing atmosphere to form the connection.

In order that the invention may be clearly understood one method in accordance with the invention will now be described by way of example with reference to the formation of a P–N junction in the manufacture of a germanium rectifier assembly for use at high current levels.

The assembly comprises four essential elements, a copper block acting as one terminal electrode, a Nicosel disc, a germanium disc and a bead of indium, the elements being arranged in that order. The copper block of cylindrical shape with a flat circular end and preferably arranged to be water cooled, supports the other three elements and is arranged to co-operate with a somewhat similar block forming the other terminal electrode of a complete rectifier, the two blocks being arranged in axial alignment.

The flat circular end of the copper block is tinned using solder paint. The tinned block is cleaned by washing in hot distilled water. The Nicosel disc is of diameter slightly greater than the diameter of the end of the copper block, and is tinned on one side and cleaned in the same way as the latter, and ready to be attached to the block. This attachment is done by placing the disc centrally on the circular end of the block with the untinned surface of the disc uppermost, and heating, the disc being moved from side to side on the molten solder layer while the exposed tinned surfaces are painted with a suitable flux. While the assembly is still hot the exposed surface of the Nicosel disc is tinned using solder paint and a layer of solder about 1/16 inch thick is melted onto the surface and allowed to cool. The copper block and solder layer are next washed and then outgassed at 550° C.–670° C. in vacuum. Excess solder is then removed, by machining, from the exposed surface of the Nicosel until a thickness of 0.008–0.010 inch remains.

The germanium disc, which is a slice of single crystal n-type material, slightly smaller in diameter than the circular end of the copper block, is prepared, prior to attachment to the Nicosel disc, in a manner which will now be described. The disc is etched using "Superoxol" etch, prepared by mixing 10 ml. 40% hydrofluoric acid, 10 ml. 100 vol. hydrogen peroxide and 40 ml. distilled water, at a temperature 20° C. and for about fifteen minutes, the disc afterwards being washed in distilled water and dried. The disc is next placed in a metal mask so that the whole of the surface which will later be placed in contact with the tinned Nicosel and the portion only of the other surface where wetting with indium is required to take place are exposed, the mask being then placed in the chamber of an evaporation plant, and the chamber evacuated. A layer of gold is evaporated onto the unmasked portion of the germanium surfaces.

A parallel sided slice of indium, about 1.5 mm. thick and having a diameter equal to that of the smaller of the evaporated gold layers is cut from an ingot of indium which has been outgassed. The copper block is placed in a furnace with the germanium disc resting on the tinned surface of the Nicosel disc so that its surface to the whole of which gold has been deposited, is in contact with the solder. The indium slice is next placed exactly over the restricted gold layer on the upper surface of the germanium slice. The furnace is closed, purged with dry argon and evacuated. The assembly is heated under vacuum until the indium and the solder have melted, whereupon dry argon at atmospheric pressure is introduced into the furnace and heating is continued up to 550° C. Thereafter the assembly is allowed to cool in dry argon.

In order to clean the region around the periphery of the indium bead where the junction emerges at the surface, the exposed copper and indium surfaces are masked with lacquer, and the assembly is etched, and washed in distilled water.

Finally, the assembly is incorporated in a hermetically sealed envelope.

I claim:

1. A method of forming a junction in a semiconductor by applying to the surface of a solid body of the semiconductor a material which consists at least partly of a substance capable of acting in the semiconductor as a significant impurity, comprising the steps of fusing a quantity of the said material in contact with said surface in vacuo, and next heating the fused material further in a non-oxidizing atmosphere at at least about atmospheric pressure, the fused material being caused to dissolve part of the body, and subsequently allowing the fused material to solidify in said non-oxidizing atmosphere in such a manner that a layer of the semiconductor containing the said substance is redeposited from the fused material contiguous with the remainder of the semiconductor body.

2. A method of forming a junction in a semiconductor as claimed in claim 1 wherein the fused material is allowed to solidify in an atmosphere of dry argon.

3. A method of forming a mechanical or an electrical connection to a semiconductor, or to a rectifying element incorporating a semiconductor, by applying to the surface of said semiconductor or rectifying element a fused metal and subsequently allowing said metal to solidify to form the said connection, wherein the metal is fused in contact with said surface in vacuo, next heated further in a non-oxidizing atmosphere at at least about atmospheric pressure, and subsequently allowed to solidify in said non-oxidizing atmosphere to form the said connection.

4. A method of forming a mechanical or an electrical connection as claimed in claim 3 wherein the metal is indium.

5. A method of forming a mechanical or an electrical connection as claimed in claim 3 wherein the metal has been outgassed prior to its being fused in contact with said surface.

References Cited in the file of this patent

UNITED STATES PATENTS

| | | |
|---|---|---|
| 2,781,481 | Armstrong | Feb. 12, 1957 |
| 2,785,095 | Pankove | Mar. 12, 1957 |
| 2,788,299 | Dawson et al. | Apr. 9, 1957 |
| 2,789,068 | Maserjian | Apr. 16, 1957 |
| 2,805,968 | Dunn | Sept. 10, 1957 |

OTHER REFERENCES

N. P. Allen, J. Inst. Metals, 1932, 49, 317–340.